United States Patent [19]

Eichelberger et al.

[11] Patent Number: 4,878,991
[45] Date of Patent: Nov. 7, 1989

[54] SIMPLIFIED METHOD FOR REPAIR OF HIGH DENSITY INTERCONNECT CIRCUITS

[75] Inventors: Charles W. Eichelberger, Schenectady; Robert J. Wojnarowski, Ballston Lake, both of N.Y.

[73] Assignee: General Electric Company, Schenectady, N.Y.

[21] Appl. No.: 283,095

[22] Filed: Dec. 12, 1988

[51] Int. Cl.[4] ............................ C23F 1/02; B44C 1/22; C03C 15/00; B29C 37/00
[52] U.S. Cl. .................................... 156/630; 156/634; 156/637; 156/652; 156/655; 156/656; 156/666; 156/668; 156/247; 156/344
[58] Field of Search ............... 156/630, 631, 634, 637, 156/638, 639, 652, 655, 656, 666, 668, 901, 902, 247, 344; 357/65, 67, 68, 71; 437/180, 210, 923

[56] References Cited

U.S. PATENT DOCUMENTS

| | | | |
|---|---|---|---|
| 4,714,516 | 12/1987 | Eichelberger et al. | 156/628 |
| 4,780,177 | 10/1988 | Wojnarowski et al. | 156/643 |
| 4,783,695 | 11/1988 | Eichelberger et al. | 357/65 |

OTHER PUBLICATIONS

H. S. Cole et al., *Laser Processing for Interconnect Technology*, SPIE, vol. 877, Micro-Optoelectronic Materials (1988), pp. 92-96.

C. W. Eichelberger et al., *High-Density Interconnects for Electronic Packaging*, SPIE, vol. 877, Micro-Optoelectronic Materials (1988), pp. 90-91.

*Primary Examiner*—William A. Powell
*Attorney, Agent, or Firm*—Marvin Snyder; James C. Davis, Jr.

[57] ABSTRACT

A simplified method of gaining access to, for the purpose of replacing, a defective integrated circuit chip situated in a high density interconnect (HDI) circuit (10) comprises heating the HDI circuit to a temperature at which the peel strength of an adhesive (16) bonding a polymer overlay layer (18) to the tops of integrated circuit chips (4, 6, and 8) positioned on a substrate (12) is reduced. The polymer overlay layer, which may comprise one or multiple layers, is then peeled from the chips. The adhesive is present in sufficient quantity to protect the chips. The adhesive is then dissolved by subjecting the substrate to different solvents of successively lower solubility for the adhesive. Metal divots (34) left on chip pads (36) are removed by selectively etching copper in the presence of ultrasonic agitation. The entire circuit is finally subjected to a high pressure spray to remove any particulate remaining on the chips, so that the defective chip may be readily replaced without damaging or contaminating the HDI circuit.

19 Claims, 3 Drawing Sheets

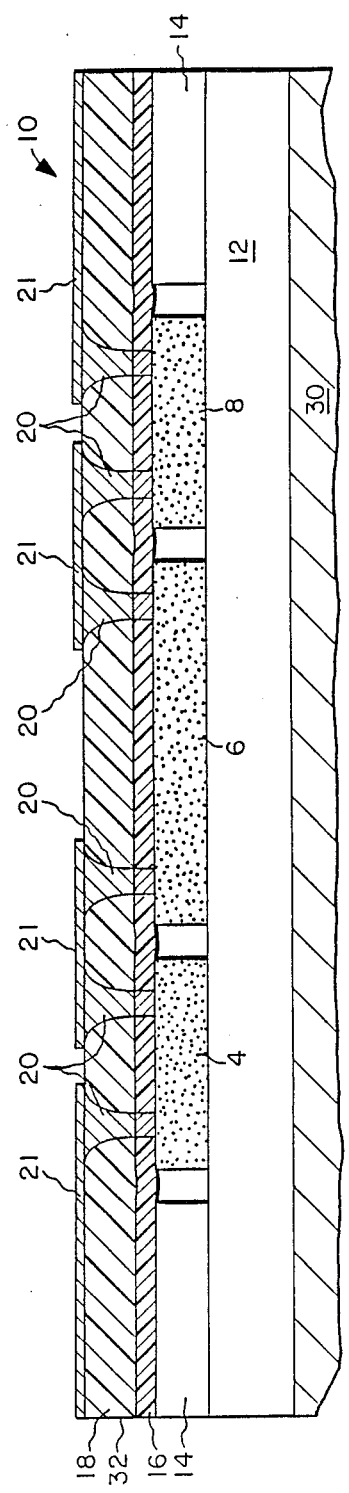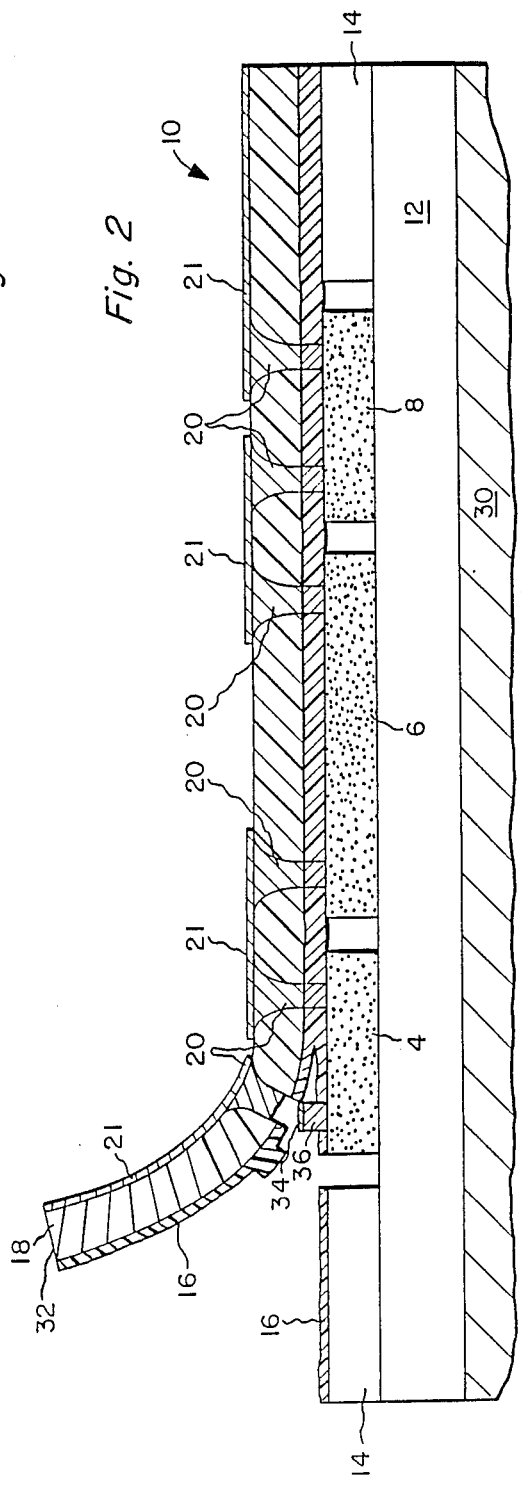

SIMPLIFIED METHOD FOR REPAIR OF HIGH DENSITY INTERCONNECT CIRCUITS

CROSS-REFERENCE TO RELATED APPLICATIONS

This application is related to the following co-pending applications which are assigned to a common assignee and are incorporated herein by reference:

"An Adaptive Lithography System to Provide High Density Interconnect", Ser. No. 947,461, filed Dec. 29, 1986, U.S. Pat. No. 4,835,704;

"Integrated Circuit Packaging Configuration for Rapid Customized Design and Unique Test Capability", Ser. No. 912,457, filed Sept. 26, 1986;

"Method and Apparatus for Packaging Integrated Circuit Chips Employing a Polymer Film Overlay Layer", Ser. No. 240,367, filed Aug. 30, 1988, continuation of Ser. No. 912,458, filed Sept. 26, 1986, now abandoned;

"Method and Configuration for Testing Electronic Circuits and Integrated Circuit Chips Using a Removable Overlay Layer", Ser. No. 230,654, filed Aug. 5, 1988, continuation of application Ser. No. 912,454, filed Sept. 26, 1986, now abandoned;

"High Density Interconnect with High Volumetric Efficiency", Ser. No. 250,010, filed Sept. 27, 1988; and "Method and Apparatus for Removing Components Bonded to a Substrate", Ser. No. 249,927, filed Sept. 27, 1988, and "Laser Interconnect Process", Ser. No. 253,020, filed Oct. 4, 1988.

BACKGROUND OF THE INVENTION

1. Field of the Invention

This invention is related to an improved method of repairing high density interconnect (HDI) circuits and, more particularly, is directed to an improved method for gaining access to, for the purpose of replacing, a defective integrated circuit chip situated in a high density interconnect circuit, the improved method being simpler and less damaging than previous methods of repairing HDI circuits.

2. Description of the Prior Art

HDI circuits are comprised of a plurality of integrated circuit chips mounted on a substrate where the chips are interconnected by a metallization pattern created on a polymer overlay layer. In some HDI circuits, a multilayer interconnect pattern is formed over the chips and is comprised of a multiplicity of polymer overlay layers with each layer having its own interconnect pattern formed thereon. Typically, the interconnect pattern is formed by a computer-controlled laser lithography system. The above-referenced co-pending patent applications describe and illustrate these circuits in detail.

An important objective of HDI circuit technology is to provide the ability to gain clear access to any defective integrated circuit chip contained in the HDI circuit, so as to have the ability to replace such chip without damaging or contaminating the HDI circuit. This necessitates having capability to remove the polymer overlay layer and replace it with a new polymer overlay layer without damage to the chips below. In the above-referenced co-pending patent application Ser. No. 912,456, now U.S. Pat. No. 4,783,695 issued Nov. 8, 1988 a batch process for removing multiple layers of polymer overlays is described. This batch process includes etching or dissolving the metallization pattern, followed by etching or dissolving the polymer layer. For multilayer interconnects, this process is cyclically repeated until only the first-applied polymer layer and interconnect pattern formed thereover remains. The copper layer of the interconnect metallization is then removed by dissolving it in a bath of nitric acid, sulfuric acid, and phosphoric acid. The titanium layer of the interconnect metallization is then removed by reactive ion etching (RIE) in gaseous $CF_4$. After the titanium is cleaned from the integrated circuit chip pads, the RIE plasma gas is changed to oxygen enhanced by $CF_4$ and the polymer overlay layer, preferably Kapton ® polyimide film available from E.I. du Pont de Nemours and Company of Wilmington, Delaware, and the bonding adhesive, usually Ultem ® thermoplastic resin available from General Electric Company, Pittsfield, Massachusetts, are etched. The process yields a substrate with bare, clean chips mounted thereon and ready for reprocessing. In the above-referenced co-pending patent application Ser. No. 230,654, another batch process for removing a polymer overlay layer is described. The latter batch process includes dissolving the copper metallization with a mixture of nitric acid, sulfuric acid, and phosphoric acid, dissolving the titanium metallization with fluoroboric acid, and removing the overlay polymer and adhesive by immersion in tetrahydrofuran (THF). As an alternative, methylene chloride can be used to lift off the polymer overlay layer after the metallization has been dissolved, as stated in the above-referenced co-pending patent application Ser. No. 230,654.

Several drawbacks to using the removal methods described above have been encountered. One is that no completely selective etch for titanium over aluminum is available. Therefore, the aluminum pad of an integrated circuit chip is at risk during the titanium etch. Repeated repairs could result in the pad area being attacked and the chip ultimately becoming inoperative. A second drawback relates to the chip being vulnerable to scratches. Kapton polyimide film is a very tough material and a loosened, floating Kapton overlay layer could slide against the top of the chip and scratch the surface. Although the adhesive layer which holds the overlay layer on the tops of the chips may provide some protection against scratching, this protection can be lost if the substrate is left in the solvent long enough for it all to be dissolved. A third drawback stems from the repetition required to remove multilayer interconnect patterns. The reason for employing a cycling procedure is due to the fact that dielectric materials act as a stopper for removal of metallization, and metallization acts as a stopper for dielectric removal. Nevertheless, removal of metallization followed by removal of a dielectric layer in a repeating cycle adds complexity to the overall repair process. A fourth drawback is encountered when a repair is attempted on circuits that use a metal other than copper on the layers above the first (i.e., lowermost) layer. For example, in circuits where the upper layer of metal is connected to wire bonding which, in turn, is connected to the package pins, the metal layer of choice is aluminum or gold. When etching aluminum during the repair process, there is a risk that the aluminum pad on an integrated circuit chip will be exposed to the etchant and be damaged. Use of gold does not avoid this risk since gold etchants generally attack aluminum as well.

SUMMARY OF THE INVENTION

It is therefore an object of this invention to provide a method for repair of HDI circuits which is simple and which poses minimal risk of damage to the interconnected integrated circuit chips.

Another object of the invention is to provide a repair method which leaves a protective barrier layer between the overlay layer and the top of the chips until the overlay layer is removed.

Another object of the invention is to provide a method for repair of HDI circuits which requires the same number of steps for removing one layer as for multiple layers.

According to the invention, the overlay removal process can be described in terms of four basic steps. First, the overlay layer is peeled off by heating the substrate to a temperature at which the adhesive layer loses its bonding strength. Tweezers or similar grabbing devices then pull the overlay layer from the chips. The adhesive which remains behind protects the chips from possible damage should the overlay layer scrape across the tops of the chips. The peeling step is effective for removing a single layer or a multiplicity of layers simultaneously such that multilayer interconnect patterns and single layer interconnect patterns are treated identically. Second, the adhesive residue covering the substrates is removed by solvent cleaning. Successive exposure to different solvents of decreasing solubility for the adhesive ensures removal of all of the residual adhesive while avoiding any significant residue of adhesive left when a solvent evaporates, so that such residue is not subsequently washed back onto the chips after the final solvent is dried. Third, metal "divots" are selectively etched from the integrated circuit chip pads. The divots are comprised of the metal deposited on the chip pads during interconnection. For divots comprised of titanium-copper-titanium in a sandwich configuration, the copper middle layer is attacked using nitric acid and ultrasonic agitation. Nitric acid attacks copper and does not attack the aluminum chip pads, the titanium layers, or the cover glass on the chip surface. The nitric acid removes the copper layer, and hence the upper titanium layer, while leaving behind the lower titanium layer on the aluminum chip pad. Instead of being damaged by multiple repairs, the chip pads are thus actually built up slightly. The build up does not hinder the circuit functions since the titanium layer is very thin and easy to connect to during subsequent re-applications of metal. The same procedure may be employed with a chrome-copper-chrome sandwich. Fourth, any particulate remaining on the substrate is removed by spray cleaning with a high pressure spray.

After the overlay layer has been removed by the above-described process, the chips can be tested and any defective chips can be readily replaced. A new polymer overlay layer is then applied over the substrate by first applying adhesive over the substrate and integrated circuit chips, followed by pressure laminating over the chips a Kapton polyimide sheet with adhesive baked on one side. Vias are created through the Kapton sheet to the chip pads. If desired, the titanium layer on the pad surface can be removed by plasma etching using the viaed Kapton layer as a mask for die protection. A selective interconnect pattern is then created on top of the Kapton sheet. The pattern has branches which fill the vias with metal and thereby establishes electrical connections between the chips.

BRIEF DESCRIPTION OF THE DRAWINGS

The foregoing and other objects, aspects and advantages of the invention will be better understood from the following detailed description of the invention with reference to the drawings, in which:

FIG. 1 is a cross-sectional side view of an HDI substrate;

FIG. 2 is a cross-sectional side view of the HDI substrate shown in FIG. 1, with the overlay layer being peeled away;

DETAILED DESCRIPTION OF THE PREFERRED EMBODIMENTS OF THE INVENTION

Figure 3:
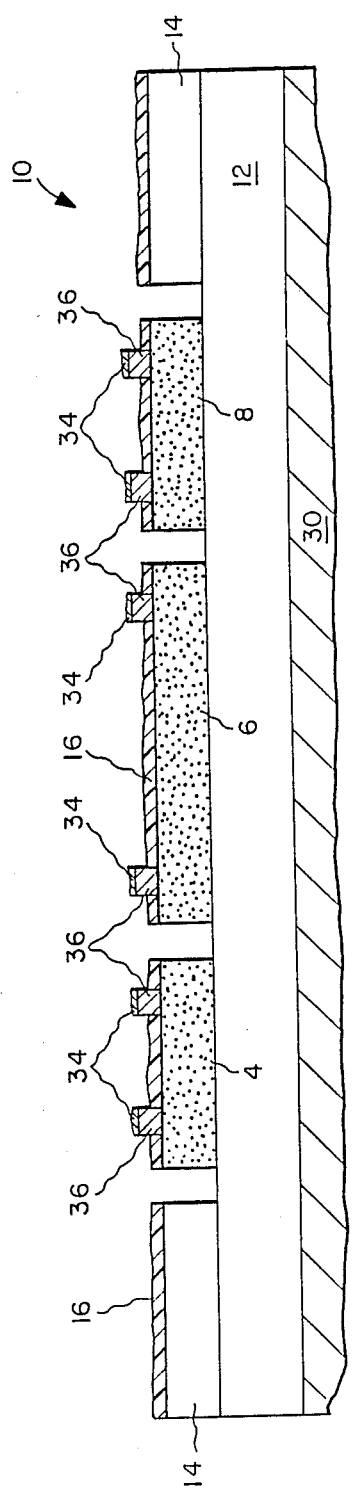
FIG. 3 is a cross-sectional side view of the HDI substrate shown in FIG. 2, with the overlay layer having been completely peeled away, and showing a residual adhesive layer remaining on the integrated circuit chips and on the substrate.

FIG. 1 shows an HDI circuit 10 comprising a substrate 12 on which is mounted a frame 14 and a plurality of integrated circuit chips 4, 6, and 8. Substrate 12 can be the semiconductor wafer itself or it may be comprised of materials such alumina, silicon, molybdenum, matrix copper and the like, provided that the material chosen has a coefficient of thermal expansion matched to chips 4, 6, and 8. Frame 14 may be comprised of one of a number of well-known frame materials, such as alumina. An adhesive 16, such as Ultem 1000 thermoplastic resin sold by the General Electric Company, Pittsfield, Massachusetts, bonds a polymer overlay layer 18 over the top of both frame 14 and integrated circuit chips 4, 6, and 8. Polymer overlay layer 18 may be comprised of processed Kapton polyimide film, available from E.I. du Pont de Nemours and Company of Wilmington, Delaware, and metal interconnect patterns 21 formed thereon. Polymer overlay layer 18 may be a single layer, or it may comprise multiple layers (when it is used in multilayer interconnect schemes). Metal-filled vias 20 extend through polymer overlay layer 18 and provide electrical connection between integrated circuits 4, 6, and 8 and metal interconnect patterns 21.

The first step of the repair process is to remove polymer overlay layer 18 from HDI circuit 10. FIGS. 1 and 2 illustrate the peeling step. HDI circuit 10 is placed on a hot plate 30 at 300° C. for approximately one minute. An edge 32 of polymer overlay layer 18 is grasped with tweezers (not shown) and peeled from HDI circuit 10. At 300° C., adhesive 16 has essentially no peel strength; therefore, chips 4, 6, and 8 are not pulled up with polymer overlay layer 18 as it is peeled. The separation takes place in adhesive layer 16 near the interface between adhesive 16 and polymer overlay layer 18.

As best shown in FIG. 2, the overlay peel is comprised of Kapton film 18 and metal interconnect 21, together with some adhesive 16. A layer of residual adhesive 16 remains on frame 14 and chips 4, 6, and 8, and protects the chips from damage if polymer overlay layer 18 should scrape the tops of the chips during the removal process. An integrated circuit pad "divot" 34 remains on each of the chip 4, 6, and 8 pads. Divot 34 is comprised of the metal from the metal filled vias 20 (shown in FIG. 1) which connect the chips 4, 6, and 8 to metal interconnect pattern 21 on polymer overlay layer 18.

FIG. 3 shows HDI circuit 10 after polymer overlay layer 18 has been peeled away. Regardless of the number of layers in polymer overlay layer 18, the only residual material remaining on the substrate chips after peeling is the residue of adhesive 16 and the metal divots 34 above each pad 36 on integrated circuit chips 4, 6, and 8. Divots 34 are generally comprised of a titanium-copper-titanium sandwich but they may, in the alternative, be chrome-copper-chrome or similar compositions. The composition of the divot depends on the type of metal used when forming the metal interconnect patterns on polymer overlay layer 18. Chip pads 16 on the integrated circuits are generally comprised of aluminum.

After polymer overlay layer 18 is peeled away, HDI circuit 10 is permitted to cool. The next step is to remove all the residue of adhesive 16 without attaching the die attach polymer which holds chips 4, 6, and 8 to substrate 12 and without leaving behind any residue that could impede removal of metal divots 34 or adversely impact application of a new adhesive layer. The die attach polymer is Ultem 6000 resin, sold by General Electric Company. The preferred process for removing adhesive 16 involves starting with a good solvent for the adhesive and progressively changing to solvents that are not as good. The objective is to prevent residue from being left on the chips when a solvent evaporates. The steps are as follows: dip in methylene chloride for thirty seconds, dip again in fresh methylene chloride for thirty seconds, dip once again in fresh methylene chloride for thirty seconds, then dip in 4-methylanisole, then dip in acetone for thirty seconds, and finally dip in Freon®TF fluorinated hydrocarbon solvent (sold by E.I. du Pont de Nemours and Company) for thirty seconds and blow dry. This series of solvents leaves integrated circuit chips 4, 6, and 8 free of adhesive 16 and does not attack the die attach material.

Figure 4:
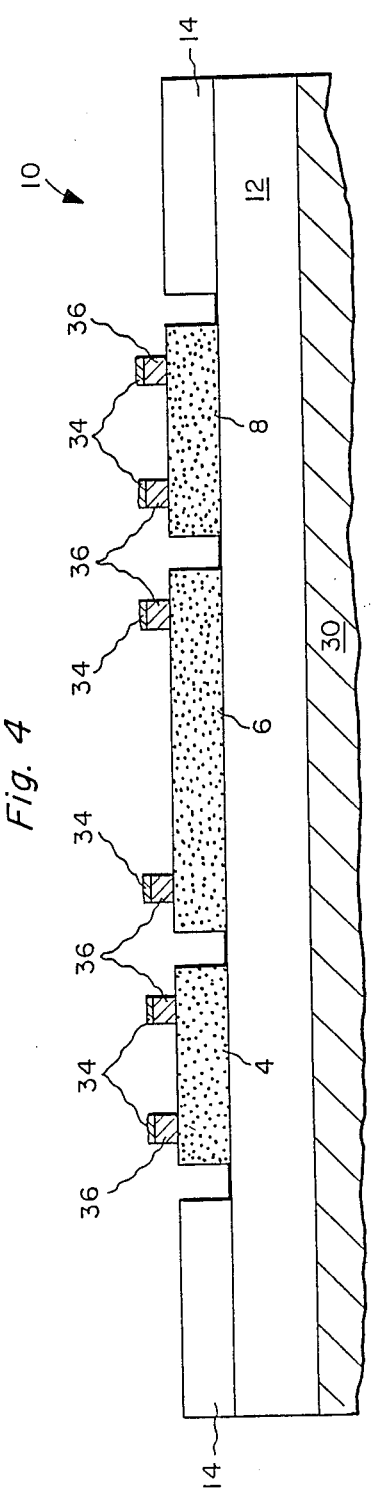
FIG. 4 is a cross-sectional side view of the HDI substrate shown in FIG. 3, with the adhesive layer having been removed, and showing metal divots remaining on the chip pads.

FIG. 4 shows HDI circuit 10 after solvent cleaning. The next step to be performed is to selectively etch divots 34 without harming chip pads 36. It has been found that exposure to a seventy percent nitric acid solution will attack the copper, but will not attack the titanium, the aluminum chip pads 35, or a cover glass (not shown) placed on chips 4, 6, and 8. Ultrasonic agitation of the etchant will assist in breaking off divots 34. The top titanium layer of divot 34 is lifted off when the copper is dissolved, while the bottom titanium layer remains behind covering aluminum chip pads 36. The titanium layer on chip pad 36 is very thin, i.e. 1000–2000 angstroms (Å), and does not pose any electrical or mechanical obstacles to subsequent reapplications of metal. If the titanium layer is left on chip pad 36, the chip pad will actually be built up by being repaired several times, rather than damaged as would be the case with prior methods of repair.

Figure 5:
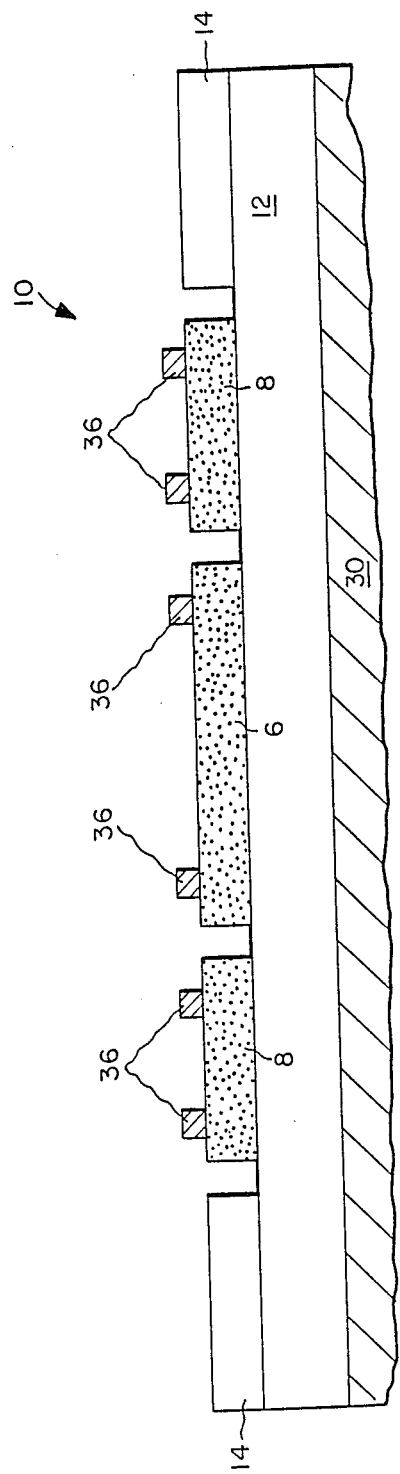
FIG. 5 is a cross-sectional side view of the HDI substrate shown in FIG. 4, with the metal divots having been removed.

FIG. 5 shows HDI circuit 10 after the metal divots have been removed from chip pads 36. The next step is to clean away any particulate which may have been picked up during the repair processing. Cleaning is preferably done with a high pressure water sprayer. For example, in an Ultratrech 602 sprayer available from Semiconductor Systems, Inc. of Santa Clara, California, HDI circuit 10 is subjected to a fan pattern of 2,500 pounds per square inch (psi) deionized water for two minutes or fourteen cycles. HDI circuit 10 is next sprayed with propanol to displace the water and is then spun dry. It is desirable to spray clean the circuit before any bad (i.e., defective) integrated circuit chips are replaced in order to prevent any particulate from being baked onto the tops of the chips during the replacement procedures.

The final steps of the repair process are to replace any bad chips found on substrate 12 and reapply a polymer overlay layer 18. Replacing bad integrated circuit chips, applying a new polymer overlay layer, and creating a metal interconnect pattern proceeds according to procedures disclosed in the above-identified co-pending patent applications.

A bad integrated circuit chip, which might be chip 6, for example, can be identified with standard test methods. The die attach material holding the chip to substrate 12 is then melted and the defective chip, assuming it to be chip 6, is removed and replaced by a good (i.e., completely functional) integrated circuit chip 7. After bad chip 6 is replaced with good chip 7, HDI circuit 10 is spray washed again. Frequently, however, none of chips 4, 6, or 8 needs to be replaced and only polymer overlay layer 18 of HDI circuit 10 needs to be repaired or reapplied.

After spray washing, Ultem 1000 adhesive 16 is sprayed over cleaned substrate 12, frame 14, and chips 4, 6, and 8. The adhesive is dried for ten minutes at 100° C., then baked for ten minutes at 150° C., and finally heated for twenty minutes at 300° C. A processed Kapton sheet (not shown) with adhesive baked on one side is next pressure laminated over chips 4, 6, and 8 at a pressure of 30 psi and at a temperature of 260° C. Vias are formed through the Kapton sheet to chip pads 36 using a laser to create openings in the sheet. Plasma etching may be used to clean up soot left in the via openings. An optional etch can be performed to remove the titanium or chrome from aluminum chip pads 36. The optional etch ensures that sputtered metal will electrically connect with a clean chip pad 36 surface and needs to be performed only if multiple repairs are anticipated. The optional etch proceeds as follows: first, preheat a plasma chamber to 110° C., then etch in 20% $CF_4$ and $O_2$ for two minutes to clean up soot, and then etch in 80% $CF_4$ and $O_2$ to etch back the titanium on the aluminum pad. The overlaying Kapton sheet acts as an etch resist and protects all areas where via openings have not been formed; therefore, the cover glass on the chips is protected from being attacked by the $CF_4$ plasma.

The above-described repair process has been tested to demonstrate that integrated circuit chips are not damaged while using the inventive procedure. Eight pad array substrates comprised of an array of four chips containing hundreds of pads per chip and four 7400 integrated circuit chips on each substrate were processed for the test. The chips which were used did not have protective glass so that even slight scraping would damage the aluminum interconnect. The eight pad array substrates were processed and measured for resistance of the via strings and the functionality of the 7400 integrated circuit chip logic. An overlay layer was removed and reapplied as described above. At various junctures during the test, the resistance of the via strings and the logic functionality of the four 7400 integrated circuit chips were tested. Each chip was inspected for damage. A total of eleven repair cycles were performed. No damage was observed during the test, i.e., there was no change in resistance of the via strings, and the logic of the four 7400 integrated circuit chips functioned properly on all eight substrates. Following the repair cycle, the circuits were subjected to the environmental test procedures of Military Standard 883 with no failures. The experiment demonstrates that the repair process is remarkably risk free and can be used to reliably repair HDI circuits at least eleven times.

While the invention has been described in terms of a preferred method for removing a polymer overlay layer and for cleaning up the underlying chips, those skilled in the art will recognize that alternative arrangements, including methods for reducing peel strength of the adhesive, for dissolving the adhesive, and for selectively etching the divot, may be substituted within the spirit and scope of the appended claims.

Having thus described the invention, what we claim as new and desire to secure by Letters Patent is set forth in the following claims:

1. A method of gaining access to, for the purpose of replacing, a defective integrated circuit chip situated in a high density interconnect circuit wherein a polymer overlay layer is bonded by an adhesive to the upper surfaces of integrated circuit chips positioned on a substrate, comprising the steps of:
   peeling said polymer overlay layer from said integrated circuit chips;
   removing any adhesive remaining on said integrated circuit chips;
   applying an etchant to metal deposits on contact pads situated on said integrated circuit chips so as to remove said deposits; and
   washing particulate from said integrated circuit chips and said substrate.

2. The method of claim 1 including the step of reducing peel strength of said adhesive before peeling said polymer overlay layer from said integrated circuit chips.

3. The method of claim 2 wherein said step of reducing peel strength comprises heating said high density interconnect circuit to a temperature which reduces said peel strength of said adhesive.

4. The method of claim 2 wherein sufficient adhesive is left on said integrated circuit chips following the step of peeling said polymer overlay layer to protect said integrated circuit chips from being damaged by movement of said polymer overlay layer.

5. The method of claim 1 wherein the step of removing any adhesive remaining on said integrated circuit chips comprises the steps of:
   dipping said substrate in a solvent for said adhesive to enable said solvent to dissolve said adhesive; and
   removing said solvent containing dissolved adhesive from said substrate.

6. The method of claim 1, further comprising the step of ultrasonically agitating said etchant.

7. The method of claim 1 wherein said etchant is selective for copper.

8. The method of claim 1 wherein the step of washing particulate comprises spraying said integrated circuit chips and said substrate with high pressure deionized water.

9. The method of claim 8 including the final step of displacing said deionized water from said integrated circuit chips and said substrate.

10. A method of gaining access to, for the purpose of replacing, a defective integrated circuit chip situated in a high density interconnect circuit wherein a polymer overlay layer is bonded by an adhesive to the upper surfaces of integrated circuit chips positioned on a substrate, comprising the steps of:
    reducing peel strength of said adhesive bonding said polymer overlay layer to the upper surfaces of said integrated circuit chips positioned on said substrate;
    peeling said polymer overlay layer from said integrated circuit chips such that a quantity of said adhesive is left on said integrated circuit chips;
    removing said quantity of adhesive left on said integrated circuit chips;
    etching metal deposits from contact pads situated on said integrated circuit chips; and
    washing particulate from said integrated circuit chips and said substrate.

11. The method of claim 10 wherein said adhesive comprises a thermoplastic resin and the step of reducing peel strength of said adhesive comprises heating said high density interconnect circuit to a temperature which reduces said peel strength of said adhesive.

12. The method of claim 10 wherein sufficient adhesive is left on said integrated circuit chips following the step of peeling said polymer overlay layer to protect said integrated circuit chips from being damaged by movement of said polymer overlay layer.

13. The method of claim 10 wherein the step of removing said quantity of adhesive left on said integrated circuit chips comprises the steps of:
    dipping said substrate in a solvent for said adhesive to enable said solvent to dissolve said adhesive; and
    removing said solvent containing dissolved adhesive from said substrate.

14. The method of claim 11 wherein the step of removing said quantity of adhesive left on said integrated circuit chips comprises the steps of:
    dipping said substrate in a solvent for said resin to enable said solvent to dissolve said resin; and
    removing said solvent containing dissolved resin from said substrate.

15. The method of claim 10 wherein the step of etching metal deposits from contact pads comprises applying an etchant to said deposits, and ultrasonically agitating said etchant.

16. The method of claim 15 wherein said etchant is selective for copper.

17. The method of claim 10 wherein the step of washing particulate comprises spraying said integrated circuit chips and said substrate with high pressure deionized water.

18. The method of claim 17 including the final step of displacing said deionized water from said integrated circuit chips and said substrate.

19. The method of claim 15 wherein said etchant comprises nitric acid.

* * * * *